United States Patent [19]
Horan et al.

[11] Patent Number: 5,514,959
[45] Date of Patent: May 7, 1996

[54] ELECTRIC METER INCLUDING A SWITCH COVER LOCKABLE IN AN OPEN POSITION

[75] Inventors: Patrick J. Horan, Dover; Joseph R. Legere, Sanford, both of N.H.; David J. Miller, South Berwick, Me.

[73] Assignee: General Electric Company, New York, N.Y.

[21] Appl. No.: 364,090

[22] Filed: Dec. 27, 1994

[51] Int. Cl.$^6$ .............................. G01R 1/00; E05D 11/10
[52] U.S. Cl. ................................ 324/110; 16/334
[58] Field of Search .................... 324/110; 16/319, 16/334; 70/212, 203; 200/43.11–43.22

[56] References Cited

U.S. PATENT DOCUMENTS

| | | | |
|---|---|---|---|
| 3,000,049 | 9/1961 | Terry | 16/334 |
| 4,188,575 | 2/1980 | Palmer et al. | 324/103 R |
| 4,978,816 | 12/1990 | Castonguay et al. | 70/203 |

*Primary Examiner*—Ernest F. Karlsen
*Assistant Examiner*—Russell M. Kobert
*Attorney, Agent, or Firm*—Bell Seltzer Park & Gibson

[57] ABSTRACT

An electric meter includes a housing, a switch positioned within an opening in the housing, a hinge pin having a first cross-sectional shape and being connected to the housing, and a switch cover having a passageway receiving the hinge pin therein and permitting pivotal movement of said switch cover between a closed position and an open position. The passageway has a second cross-sectional shape cooperating with the first cross-sectional shape of the hinge pin for locking the switch cover in the open position. The hinge pin preferably includes a generally cylindrical shaft and a ridge extending longitudinally thereon to define the first cross-sectional shape. Accordingly, the passageway of the switch cover is preferably defined by a generally cylindrical portion with a first longitudinally extending channel in communication therewith to define the second cross-sectional shape. The passageway may also include a second longitudinal channel cooperating with the ridge to lock the switch cover in the closed position.

20 Claims, 5 Drawing Sheets

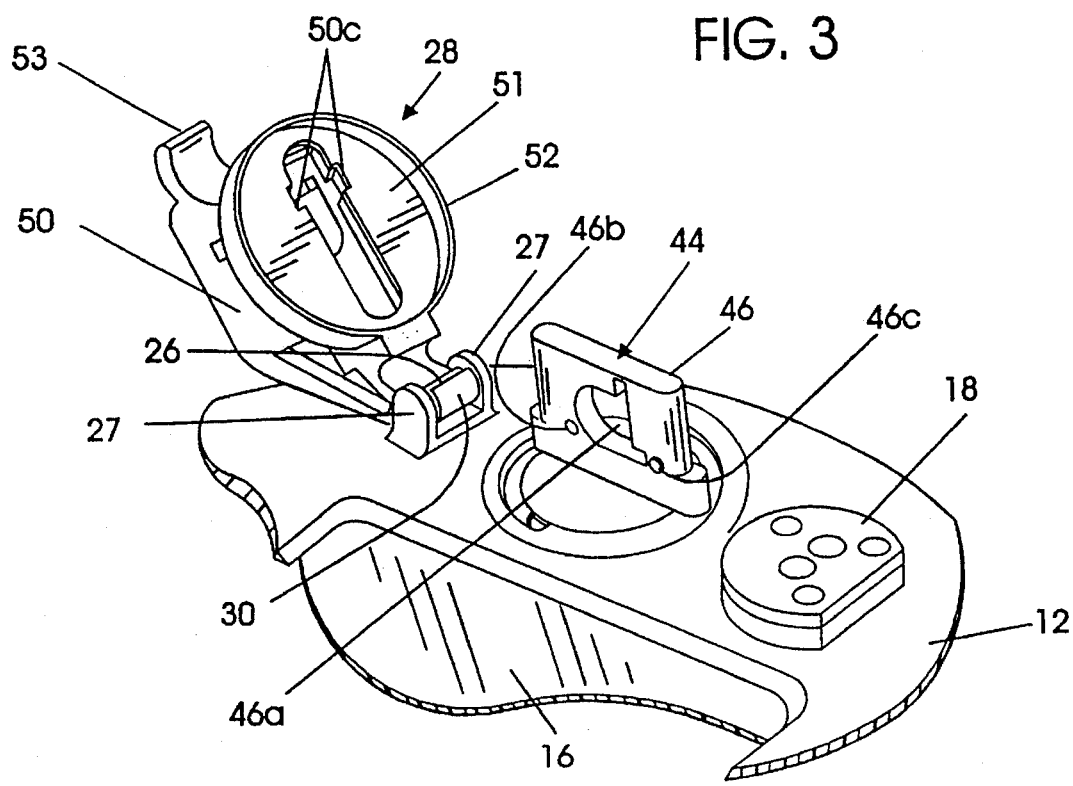
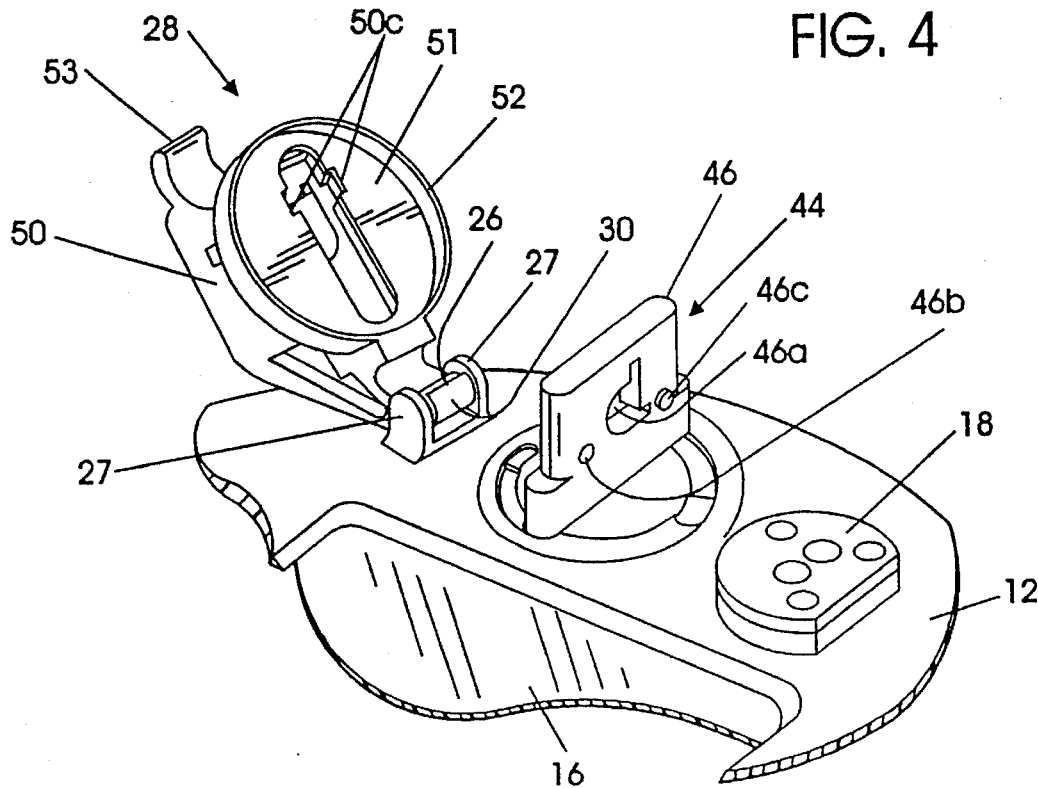

ELECTRIC METER INCLUDING A SWITCH COVER LOCKABLE IN AN OPEN POSITION

FIELD OF THE INVENTION

The present invention relates to the field of electricity meters, and, more particularly, to an electricity meter including a switch and an associated switch cover.

BACKGROUND OF THE INVENTION

A typical electronic watthour meter for measuring electric energy consumption requires resetting of the demand function after periodic reading of the meter, such as every month. The reset is typically accomplished by activating a reset switch located within the meter housing by depressing a plunger connected to the switch and extending through an opening in the housing. For example, an early prototype version of the General Electric EVX meter produced by the assignee of the present invention, included a plunger carried by the housing. The plunger, once rotated 90° to an activate position, could be depressed by the technician to activate the reset switch positioned within the meter housing to thereby reset the meter.

Tampering with the reset plunger is typically discouraged by the provision of a switch cover or latch cover for the plunger. The switch cover is typically pivotally connected to the meter housing and is movable between open and closed positions. In the open position, the plunger may be rotated and depressed to reset the meter. In the closed position, activation of the plunger is not possible, since the plunger cannot be rotated or depressed. Moreover, the switch cover typically allows for a wire, band or padlock seal to be used to secure the switch cover in the closed position.

An early prototype EVX meter, for example, included a plunger having a thumbgrip portion which permitted the technician to grasp and then rotate the plunger. The thumbgrip portion included a circular opening in communication with a slotted opening thereby permitting insertion of either a padlock or tape seal. The latch cover of this early prototype meter had a rectangular cutout roughly aligned with the openings in the plunger. Accordingly, a seal or padlock would retain the latch cover in the closed position and prevent operation of the plunger. Unfortunately, the padlock or seal of the early EVX meter was supported only by the thumbgrip portion of the plunger. Accordingly, the plunger could be damaged by manipulation of the seal or padlock thereby requiring replacement of the plunger.

The switch cover of the early EVX meter was snapped in place on a hinge pin integrally molded into the housing or meter cover. In addition, an external bump was molded on an outer portion of the switch cover to attempt to provide means for holding the latch cover in the open position when the plunger was accessed by a technician. The convenience of the technician is enhanced if the cover may be secured in the open position. Unfortunately, the early EVX meter cover latch did not provide the desired positive locking in the open position. Moreover, the typical plastic materials used for a meter housing and for the associated switch cover and hinge pin may be susceptible to both molded-in stresses and stresses produced during operation. These stresses are amplified particularly in the presence of notches, nicks, cuts, etc. Environmental influences may also degrade the typical polycarbonate plastic material and may lead to a failure of the switch cover to remain in the open position.

Another disadvantage of the early EVX meter resulted from the hinge portion of the switch cover defining an exposed opening for moisture and dirt to enter into the area between the hinge pin and hinge portion. Accordingly, the long term reliability of the hinge may suffer.

SUMMARY OF THE INVENTION

In view of the foregoing background, it is therefore an object of the present invention to provide an electric meter with a switch cover that is self-supporting in the open position to permit a technician to have both hands free for other tasks.

It is another object of the invention to provide an electric meter having a latch cover which is readily manufactured and assembled to the meter housing.

These and other objects, features and advantages of the present invention are provided by an electric meter including a housing, switch means positioned within an opening in the housing, a hinge pin connected to the meter housing, and a switch cover having a passageway for receiving the hinge pin and permitting pivotal movement of the switch cover between a closed position and an open position. The hinge pin has a first cross-sectional shape cooperating with a second cross-sectional shape of the passageway for locking the switch cover in the open position. When in the open position, the switch cover remains in the open position permitting the meter technician to have both hands free, such as to access the switch means.

The switch cover preferably includes a body portion for covering the switch means when in the closed position, and a hinge portion connected to the body portion and defining the passageway for receiving the hinge pin. The hinge portion preferably is hookshaped and is connected to the body portion so that the open portion of the hook shape is positioned facing the body portion so as to shield the opening from entry of dirt and moisture when the switch cover is in the closed position. To facilitate manufacturing and assembly, both the body portion and the hinge portion of the switch cover are preferably formed of integrally molded plastic.

The hinge pin is preferably a cylindrical shaft having a ridge extending longitudinally thereon. The passageway of the switch cover hinge portion is preferably defined by a cylindrical portion and having a first longitudinally extending channel in communication therewith for cooperating with the ridge to lock the switch cover in the open position. The passageway is preferably further defined by a second longitudinally extending channel spaced from the first channel for cooperating with the ridge to lock the switch cover in the closed position.

The body portion of the switch cover preferably includes an upper wall and a pair of spaced apart side walls depending therefrom. The switch means preferably comprises a plunger rotatably mounted in the opening in the meter housing, and wherein the plunger includes a grip portion positioned between the side walls of the switch cover when the switch cover is in the closed position. Moreover, the side walls of the switch cover and the grip portion preferably have coextensive and aligned openings for receiving one of a padlock seal, a band seal, and a wire seal therethrough to secure the switch cover in the closed position and to prevent rotation of the grip portion of the plunger.

BRIEF DESCRIPTION OF THE DRAWINGS

FIG. 3 is an enlarged fragmentary view of a portion of the meter as shown in FIG. 1 with the latch cover in the open position.

FIG. 4 is an enlarged fragmentary view of a portion of the meter as shown in FIG. 1 with the latch cover in the open position and the plunger rotated to the activate position.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
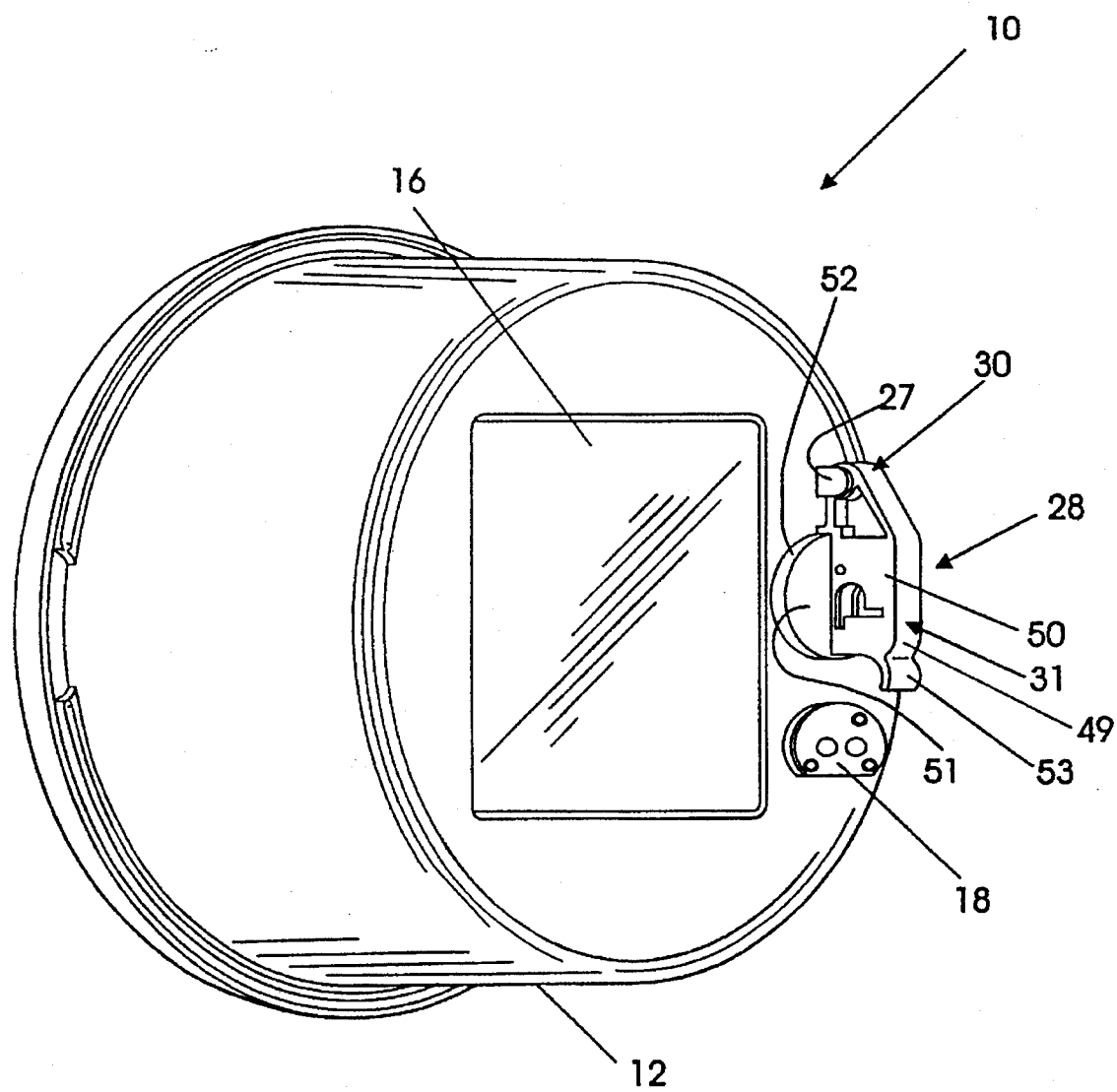
FIG. 1 is a perspective view of an electric meter according to the invention.
Figure 2:
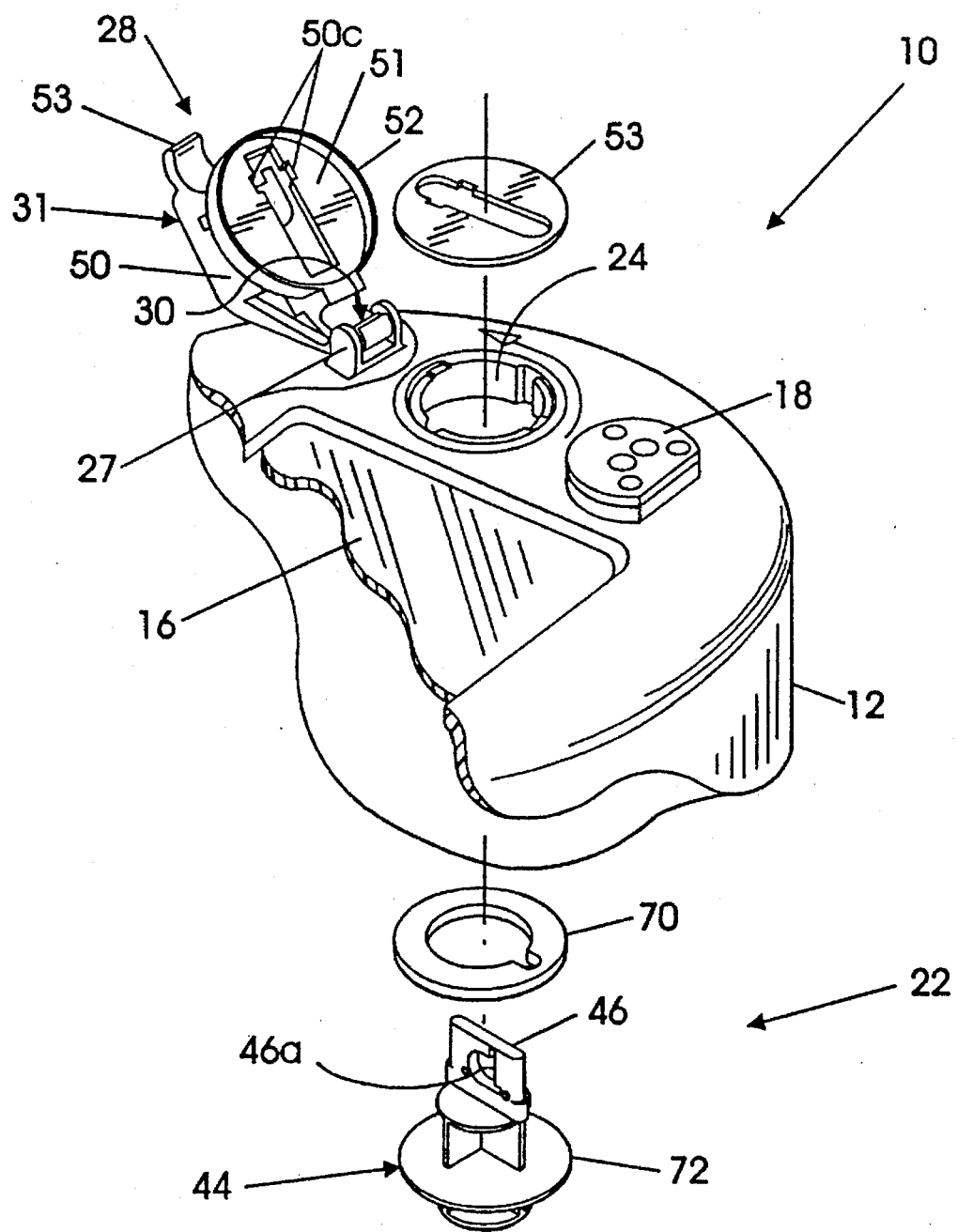
FIG. 2 is an exploded perspective view of the meter shown in FIG. 1.

Referring initially to FIGS. 1 and 2, the electric meter 10 according to the invention is first described. The electric meter 10 may be used for measuring watthours, varhours or other quantities as would be readily appreciated by those skilled in the art. The meter 10 includes a generally cylindrical housing 12, switch means 22, such as for resetting the demand function of the meter, and a switch cover 28. The switch cover 28 is pivotally connected to the meter housing 12 such that the switch cover can be moved between open and closed positions to facilitate access to the switch means 22. The switch cover 28 is self-supporting in the open position to thereby permit the technician to access the switch means 22 with both hands free. In addition, the switch cover 28 will also remain in the closed position to facilitate locking the switch cover.

In the preferred operating orientation (FIG. 1) the meter 10 is mounted on a vertical surface so that the switch cover 28 opens and closes in a generally vertical direction. In the illustrated embodiment, the switch cover 28 is connected to the outer face of the meter housing 12 adjacent a display window 16 and an optical reader port 18, as would be readily understood by those skilled in the art.

Referring now additionally to FIGS. 3 and 4, the electric meter 10 includes switch means 22 positioned within an opening 24 in the meter housing 12 and accessible upon pivoting the switch cover 28 to the open position. The switch means 22 includes a plunger 44 rotatably mounted within the opening 24 of the meter housing 12. The plunger 44 includes a grip portion 46 extending through the opening 24 of the housing 12 and a body portion 72 connected to the grip portion and positioned within the housing.

After the switch cover 28 is moved to the opened position (FIG. 3), the grip portion 46 of the plunger 44 may be grasped by the technician and rotated about 90° in an illustrated counterclockwise direction (FIG. 4). The plunger 44 may then be depressed to thereby operate an electrical switch, not shown, such as to reset the meter demand function, as would be readily appreciated by those skilled in the art. As would also be readily understood by those skilled in the art, other configurations of switches and/or plungers are contemplated by the present invention.

The grip portion 46 of the plunger 44 is positioned between the side walls 50 of the switch cover 28 when the cover is in the closed position (FIG. 1). An outer gasket 52 is positioned between the switch cover 28 and the adjacent plunger and housing portions. An inner gasket 70 is also provided between the plunger body 72 and the interior surface of the adjacent housing portion. The gaskets may be formed out of cork or any other suitable moisture-resistant material as would be readily understood by those skilled in the art.

Figure 5:
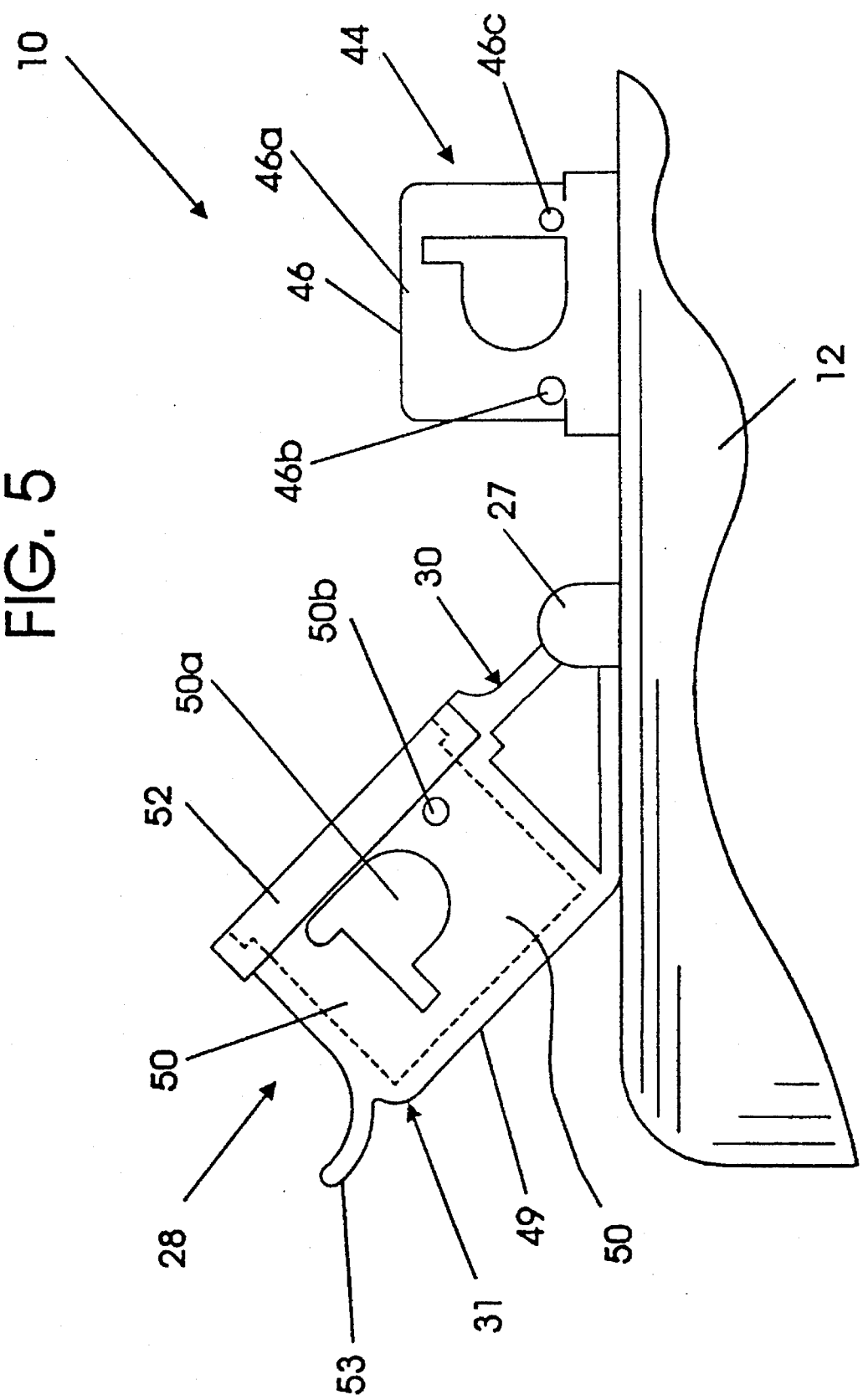
FIG. 5 is a greatly enlarged side elevational view of the meter as shown in FIG. 1.
Figure 6A:
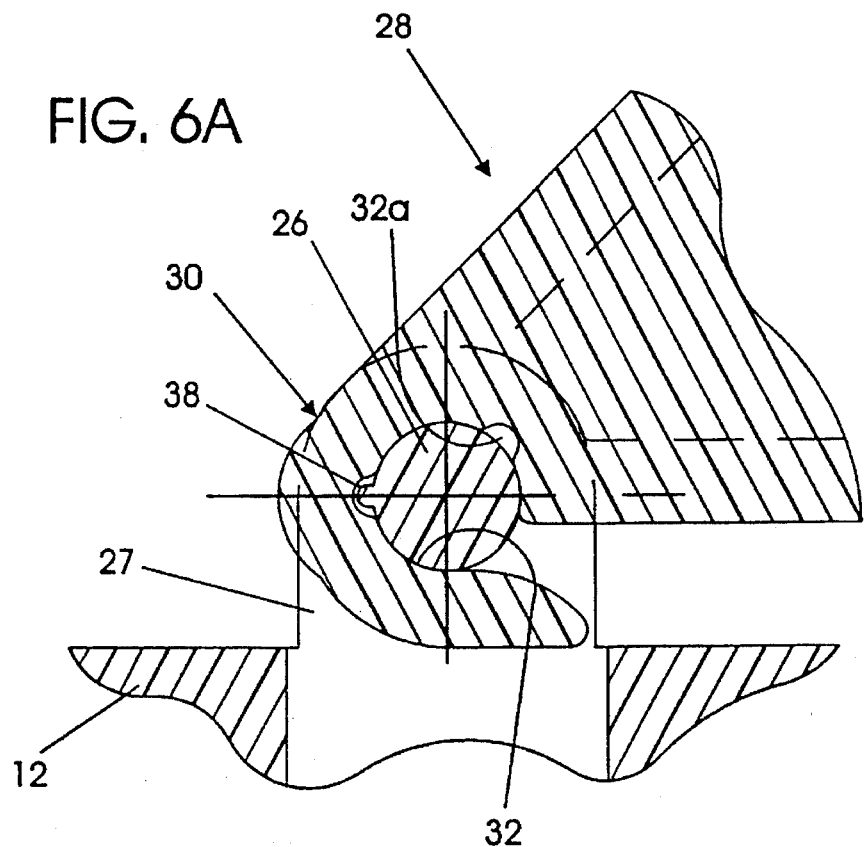
FIGS. 6A and 6B are greatly enlarged cross-sectional views of the hinge portion and hinge pin of the meter as shown in the closed and open positions respectively.
Figure 6B:
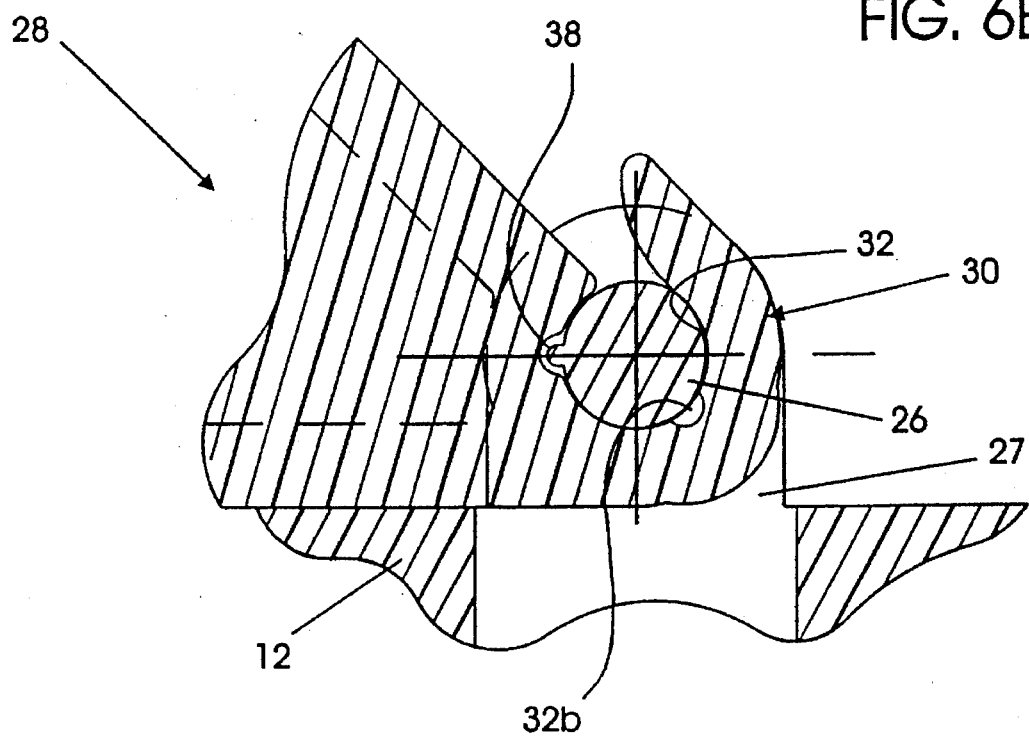

Referring now more particularly to FIGS. 5–6B, operation of the switch cover 28 is more fully explained. The switch cover 28 is pivotally connected to the hinge pin 26, which, in turn is connected to the meter housing 12 by a pair of spaced apart walls 27 integrally molded with and extending outwardly from the meter housing. The switch cover 28 includes a hook portion 30 and a body portion 34 connected thereto. The hook portion 30 of the switch cover 28 is configured such that the opening thereof is positioned to face the body portion of the switch cover 28 and wrap around the outer portion of the hinge pin 26 when in the closed position. Accordingly, assembly is facilitated, yet water or other contaminants are prevented from entering and accumulating in the area between the hinge pin 26 and the passageway 32 of the hook portion 30.

The body portion 34 of the switch cover 28 includes an upper wall 49 and a pair of spaced side walls 50 depending therefrom. The side walls 50 of the body portion 34 sandwich the grip portion 46 of the plunger 44 to thereby prevent rotation and depression of the plunger 44 when the switch cover is in the closed position. A generally circular flange 51 is connected to the lower end of the side walls 50, and a skirt 52 depends from the flange to receive the outer gasket 53 and provide an effective environmental seal.

The hook portion 36 of the switch cover 28 defines a passageway 32 receiving the hinge pin 26 and permitting pivotal movement of the switch cover 28 between a closed position (FIG. 6A) and an open position (FIG. 6B). In the illustrated embodiment, the hinge pin 26 has a generally cylindrical shaft with a ridge 38 extending longitudinally along the outer surface thereof. Accordingly, a portion of the passageway 32 is also generally cylindrical. A first longitudinal channel 32a opens to the generally cylindrical portion and is, thus, in communication therewith. Similarly, a second longitudinal channel 32b, circumferentially spaced from the first channel, is also in communication with the cylindrical portion of the passageway 32.

In the opened position (FIG. 6B), the ridge 38 of the hinge pin 26 engages the first channel 32a to retain the switch cover 28 in the open position. Similarly, in the closed position, the ridge 38 of the hinge pin 26 engages the second channel 32b to lock the switch cover in the closed position. As illustrated, the cross-sectional width of each channel 32a, 32b may be slightly greater than the cross-sectional width of the ridge 38. Molded plastic parts quite often contain high residual stresses in certain locations as a result of the molding process, such as wherever there is a dimensional transition. High stresses may also occur where there is frictional engagement of moving parts. Furthermore, environmental influences such as ultraviolet sun rays, temperature fluctuations, and humidity increase stress concentrations in molded plastics that are used in outdoor applications. The edges defined by the hinge pin 26 and ridge 38, as well as the edges defined by the first and second channels 32a, 32b are rounded over to reduce material stresses and to provide a camming action upon nearing the open or closed position. In addition, cooperation of the channels 32a, 32b and the ridge 38 provide a positive tactile indication that the cover is fully seated in the open or closed position.

As would be readily understood by those skilled in the art, the illustrated hinge pin 26 including the ridge 38 and cylindrical shaft portion is an example of a first cross-section shape. Similarly, the cylindrical portion and longitudinal channels 32a, 32b provide a second cross-sectional shape for the passageway which cooperates with the first cross-sectional shape for locking the switch cover 28 in the open and closed positions. When the switch cover 28 is pivoted from the closed position towards the open position, the ridge 38 causes a slight deflection in the hook portion 30 of the switch cover which, in turn, causes the switch cover to be urged upward until the ridge engages the first channel 32a. With the ridge 38 engaged within the first channel 32a, the switch cover 28 remains in the open position until pushed down. The forces imparted to the plastic materials of the hinge pin 26 and the hook portion 30 of the switch cover 28 by the illustrated cross-sections prevent permanent deformation of the plastic materials even after a minimum of 250 cycles of opening and closing the switch cover.

As would also be readily understood by those skilled in the art, other cooperating cross-sectional shapes for the hinge pin 26 and the passageway 32 of the hook portion 39 are also contemplated by the invention. For example, the ridge and channels may extend only partially across the hinge pin 26.

Referring now again more particularly to FIG. 5, the switch cover side walls 50 and the grip portion 46 have coextensive and aligned major openings 50a, 46a, respectively, for receiving various types of anti-tampering or locking devices, such as a padlock or band seal, as would be readily understood by those skilled in the art. The side walls 50 also include smaller circular opening 50b which are in registry with openings 46b, to thereby receive a wire seal, for example. Because the openings of the side walls and grip portion are coextensive, each component shares any loads that may be encountered, thus reducing the likelihood of damage to either the switch cover 28 or grip portion 46 of the plunger 44. In the illustrated embodiment, the side walls 50 also have internal recesses 50c (FIGS. 3 and 4) for receiving projections 46c on the grip portion 46 of the plunger 44 to help maintain the switch cover 28 in the closed position, and to reduce the need for a temporary wire seal during shipment of the meter 10.

Assembly of the plunger 44 and switch cover 28 to the meter housing 12 may be accomplished entirely by hand, without the need for tools and at a later stage in the assembly of the meter. In a preferred embodiment, the switch cover 28 and plunger 44 are injection molded thermoplastic parts made from a 9% glass-filled polycarbonate material such as General Electric Lexan® 503. Moreover, in the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An electric meter for measuring electricity and comprising:

a housing including a vertical wall, said vertical wall having an opening therethrough;

switch means positioned within the opening of said vertical wall of said housing for permitting activation thereof from external to said housing;

a horizontally extending hinge pin connected to said vertical wall of said housing above and adjacent said opening, said horizontally extending hinge pin having a first cross-sectional shape; and a switch cover having a passageway receiving said horizontally extending hinge pin therein and permitting pivotal movement of said switch cover about said horizontally extending hinge pin between a closed position, wherein said switch cover is disposed vertically against said vertical wall preventing activation of said switch means, and an open nonvertical position, permitting activation of said switch means, said passageway having a second cross-sectional shape cooperating with the first cross-sectional shape of said horizontally extending hinge pin for locking said switch cover in the open nonvertical position such that said switch cover is prevented from pivoting from said nonvertical position to said vertical position during activation of said switch means.

2. An electric meter according to claim 1 wherein said switch cover comprises:

a body portion for covering said switch means when in the closed position; and a hinge portion connected to said body portion and having a hook shape surrounding an uppermost portion of said horizontally extending hinge pin with an opening of the hook shape facing toward said body portion.

3. An electric meter according to claim 2 wherein said body portion and said hinge portion of said switch cover are integrally molded plastic.

4. An electric meter according to claim 1 wherein said horizontally extending hinge pin comprises a generally cylindrical shaft and a ridge extending longitudinally thereon to define the first cross-sectional shape, and wherein the passageway of said switch cover is defined by a generally cylindrical portion with a first longitudinally extending channel in communication therewith to define the second cross-sectional shape.

5. An electric meter according to claim 4 wherein the second cross-sectional shape of the passageway is further defined by a second longitudinally extending channel in communication with the generally cylindrical portion and spaced from the first longitudinally extending channel for cooperating with said ridge to lock said switch cover in the closed position.

6. An electric meter according to claim 5 wherein said ridge of said horizontally extending hinge pin and the first and second channels of the passageway of said switch cover define respective rounded over edges for providing a camming action during pivotal movement of said switch cover between open and closed positions.

7. An electric meter according to claim 1 wherein said switch cover comprises an upper wall and a pair of spaced apart side walls depending therefrom, wherein said switch means comprises a plunger rotatably mounted in the opening of said vertical wall of said housing, and wherein said plunger comprises a grip portion positioned between the side walls of said switch cover when in the closed position, and wherein the side walls of said switch cover and said grip portion have coextensive openings therein for receiving one of a padlock seal, a band seal, and a wire seal therethrough to secure said switch cover in the closed position and prevent rotation of the grip portion of said plunger.

8. An electric meter according to claim 1 wherein said switch cover comprises an upper wall and a pair of spaced apart side walls depending therefrom, wherein at least one of said side walls includes a recess therein, wherein said switch means comprises a plunger rotatably mounted in the opening of said vertical wall of said housing, wherein said plunger comprises a grip portion positioned between the side walls of said switch cover when in the closed position, and further comprising at least one projection on said grip portion cooperating with said recess in at least one of said side walls to further lock said switch cover in the closed position.

9. An electric meter according to claim 1 further comprising a pair of spaced apart walls extending outwardly from said housing adjacent said opening and connecting said horizontally extending hinge pin to said vertical wall of said housing; and wherein said walls, said hinge pin and said housing are integrally molded plastic.

10. An electric meter according to claim 1 wherein said switch means comprises a plunger rotatably mounted in the opening of said vertical wall of said housing, and wherein said plunger comprises a body portion positioned within the housing and a grip portion connected to said body portion and extending external to said vertical wall of said housing, and further comprising a gasket sealing said body portion to said housing.

11. An electric meter for measuring electricity and comprising:

a housing including a vertical wall, said vertical wall having an opening therethrough;

switch means positioned within the opening of said vertical wall of said housing for permitting activation thereof from external to said housing;

a horizontally extending hinge pin connected to said vertical wall of said housing above and adjacent said opening, said horizontally extending hinge pin comprising a generally cylindrical shaft and a ridge extending longitudinally on said shaft; and a switch cover comprising a body portion and a hinge portion connected to said body portion, said hinge portion having passageway therethrough receiving said horizontally extending hinge pin and permitting pivotal movement of said switch cover about said horizontally extending hinge pin between a closed position, wherein said switch cover is disposed vertically against said vertical wall preventing activation of said switch means, and an open nonvertical position, permitting activation of said switch means, said passageway defined by a generally cylindrical portion with a pair of circumferentially spaced longitudinally extending channels in communication therewith and cooperating with said ridge to lock said switch cover in respective closed and open positions.

12. An electric meter according to claim 11 wherein said hinge portion has a hook shape comprising:

a body portion for covering said switch means when in the closed position; and a hinge portion connected to said body portion and having a hook shape surrounding an uppermost portion of said horizontally extending hinge pin with an opening of the hook shape facing toward said body portion.

13. An electric meter according to claim 11 wherein said ridge of said horizontally extending hinge pin and the first and second channels of the passageway of said switch cover define respective rounded over edges for providing a camming action during pivotal movement of said switch cover between open and closed positions.

14. An electric meter according to claim 11 wherein said switch cover comprises an upper wall and a pair of spaced apart side walls depending therefrom, wherein said switch means comprises a plunger rotatably mounted in the opening of said vertical wall of said housing, and wherein said plunger comprises a grip portion positioned between the side walls of said switch cover when in the closed position, and wherein the side walls of said switch cover and said grip portion have coextensive openings therein for receiving one of a padlock seal, a band seal, and a wire seal therethrough to secure said switch cover in the closed position and prevent rotation of the grip portion of said plunger.

15. An electric meter according to claim 11 wherein said switch means comprises a plunger rotatably mounted in the opening of said vertical wall of said housing, and wherein said plunger comprises a body portion positioned within the housing and a grip portion connected to said body portion and extending external to said vertical wall of said housing, and further comprising a gasket sealing said body portion to the housing.

16. An electric meter for measuring electricity and comprising:

a plastic housing including a vertical wall, said vertical wall having an opening therethrough;

switch means positioned within the opening of said vertical wall of said housing for permitting activation thereof from external to said housing;

a plastic horizontally extending hinge pin integrally molded with said plastic vertical wall of said housing and positioned above and adjacent said opening, said horizontally extending hinge pin comprising a generally cylindrical shaft and a ridge extending longitudinally on said shaft; and a switch cover comprising a plastic body portion and a plastic hinge portion integrally molded with said body portion, said hinge portion having passageway therethrough receiving said horizontally extending hinge pin and permitting pivotal movement of said switch cover about said horizontally extending hinge pin between a closed position wherein said switch cover is disposed vertically against said vertical wall, preventing activation of said switch means, and an open nonvertical position, permitting activation of said switch means, said passageway defined by a generally cylindrical portion with a longitudinally extending channel in communication therewith and cooperating with said ridge to lock said switch cover in the open nonvertical position such that said switch cover is prevented from pivoting from said nonvertical position to said vertical position during activation of said switch means.

17. An electric meter according to claim 16 wherein said hinge portion has a hook shape comprising:

a body portion for covering said switch means when in the closed position; and a hinge portion connected to said body portion and having a hook shape surrounding an uppermost portion of said horizontally extending hinge pin with an opening of the hook shape facing toward said body portion.

18. An electric meter according to claim 16 wherein said ridge of said horizontally extending hinge pin and the channel of the passageway of said switch cover define respective rounded over edges for providing a camming action during pivotal movement of said switch cover between open and closed positions.

19. An electric meter according to claim 16 wherein said passageway is further defined by a second longitudinally extending channel in communication with the generally cylindrical portion and spaced from the first longitudinally extending channel for cooperating with said ridge for locking said switch cover in the closed position.

20. An electric meter according to claim 16 wherein the body portion of said switch cover comprises an upper wall and a pair of spaced apart side walls depending therefrom, wherein said switch means comprises a plunger rotatably mounted in the opening of said vertical wall of said housing, wherein said plunger comprises a grip portion positioned between the side walls of said switch cover when in the closed position, and wherein the side walls of said switch cover and said grip portion have coextensive openings therein for receiving one of a padlock seal, a band seal, and a wire seal therethrough to secure said switch cover in the closed position and prevent rotation of the grip portion of said plunger.

* * * * *